United States Patent
Miwa et al.

(10) Patent No.: US 11,380,518 B2
(45) Date of Patent: Jul. 5, 2022

(54) MEASUREMENT SYSTEM AND METHOD FOR SETTING OBSERVATION CONDITIONS OF MEASUREMENT APPARATUS

(71) Applicant: Hitachi, Ltd., Tokyo (JP)

(72) Inventors: Takafumi Miwa, Tokyo (JP); Hirokazu Tamaki, Tokyo (JP); Momoyo Enyama, Tokyo (JP); Makoto Sakakibara, Tokyo (JP); Sayaka Kurata, Tokyo (JP); Atsuko Shintani, Tokyo (JP); Takashi Dobashi, Tokyo (JP); Kotoko Urano, Tokyo (JP); Akiko Kagatsume, Tokyo (JP); Minseok Park, Tokyo (JP); Yasuhiro Shirasaki, Tokyo (JP); Thantip Krasienapibal, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 17/279,039

(22) PCT Filed: Aug. 9, 2019

(86) PCT No.: PCT/JP2019/031734
§ 371 (c)(1),
(2) Date: Mar. 23, 2021

(87) PCT Pub. No.: WO2020/075381
PCT Pub. Date: Apr. 16, 2020

(65) Prior Publication Data
US 2021/0407763 A1    Dec. 30, 2021

(30) Foreign Application Priority Data
Oct. 10, 2018    (JP) .............................. JP2018-192172

(51) Int. Cl.
*H01J 37/26*     (2006.01)
*H01J 37/22*     (2006.01)
*H01J 37/28*     (2006.01)

(52) U.S. Cl.
CPC .......... *H01J 37/265* (2013.01); *H01J 37/222* (2013.01); *H01J 37/28* (2013.01)

(58) Field of Classification Search
CPC .. H01J 37/00; H01J 37/02; H01J 37/26; H01J 37/265; H01J 37/22; H01J 37/222; H01J 37/28; G06F 16/00; G06F 16/903
(Continued)

(56) References Cited

U.S. PATENT DOCUMENTS

2003/0193025 A1    10/2003  Takagi
2003/0193026 A1*   10/2003  Takagi ............... G01N 23/2251
                                                              250/311
(Continued)

FOREIGN PATENT DOCUMENTS

JP    2003-303567 A    10/2003
JP    2005-17159 A     1/2005
WO    WO 2017/126425 A1    7/2017

OTHER PUBLICATIONS

International Search Report (PCT/ISA/210) issued in PCT Application No. PCT/JP2019/031734 dated Oct. 21, 2019 with English translation (three (3) pages).
(Continued)

*Primary Examiner* — Jason L McCormack
(74) *Attorney, Agent, or Firm* — Crowell & Moring LLP (57) ABSTRACT

A measurement system comprising: a measurement apparatus observing a sample based on an observation condition including parameters; and an observation condition database storing data in which a search key related to the sample and the observation condition, a control unit calculating infor-
(Continued)

mation on an observation condition of a sample is configured to: receive an observation condition search request including a search key related to a target sample; refer the observation condition database to search for the first data matching or similar to the search key related to the target sample included in the observation condition search request, calculate, based on the searched first data, a candidate observation condition of the measurement apparatus for observing the target sample, and output display data for presenting the candidate observation condition.

14 Claims, 7 Drawing Sheets

(58) Field of Classification Search
USPC .................................. 250/306, 307, 310, 311
See application file for complete search history.

(56) References Cited

U.S. PATENT DOCUMENTS

2004/0228515 A1    11/2004   Okabe et al.
2018/0325354 A1    11/2018   Saito

OTHER PUBLICATIONS

Japanese-language Written Opinion (PCT/ISA/237) issued in PCT Application No. PCT/JP2019/031734 dated Oct. 21, 2019 (seven (7) pages).

* cited by examiner

MEASUREMENT SYSTEM AND METHOD FOR SETTING OBSERVATION CONDITIONS OF MEASUREMENT APPARATUS

The present application claims priority of Japanese Patent Application No. 2018-192172 filed on Oct. 10, 2018, the entire content of which is incorporated herein by reference.

BACKGROUND OF THE INVENTION

The present invention relates to a system and a method for setting observation conditions under which a measurement apparatus observes a sample.

As a method for observing the shape and the composition of a sample of a semiconductor or the like, a method using a scanning electron microscope which is one of charged particle beam apparatuses is mentioned. In the following description, the scanning electron microscope is also referred to as the SEM.

When the sample is observed with the SEM, various types of parameters for controlling the SEM need to be set as observation conditions.

In order to appropriately set various parameters according to the type of sample to be observed, an observation target, an observation position and the like, experience and knowledge are needed. Hence, conventionally, a skilled technician sets observation conditions by trial and error.

For the problem described above, a technology disclosed in JP 2005-17159 A is known. Patent Literature 1 discloses a method in which "a plurality of image acquisition conditions and the like are set, an inspection is performed for each of the setting conditions, all defects that are detected are classified into true defects and false information by use of a defect automatic classification function and thus conditions most suitable for detection are automatically selected from among the conditions".

SUMMARY OF THE INVENTION

In a case where a large number of parameters are set, the number of combinations of values of the parameters is significantly increased. Hence, even when the method of JP 2005-17159 A is used, a cost necessary for setting observation conditions is disadvantageously increased.

A representative example of the present invention disclosed in this specification is as follows: a measurement system comprises a measurement apparatus observing a sample based on an observation condition including a plurality of parameters, and an observation condition database storing first data in which a search key related to the sample and the observation condition set in a case of observing the sample are associated with each other. The measurement system further comprises a control unit being configured to calculate information on an observation condition of a sample. The control unit being configured to: receive an observation condition search request including a search key related to a target sample; refer the observation condition database to search for the first data matching or similar to the search key related to the target sample included in the observation condition search request, calculate, based on the searched first data, a candidate observation condition of the measurement apparatus for observing the target sample, adjust at least one parameter included in the candidate observation condition to calculate new candidate observation condition in a case where a result of a measurement performed by the measurement apparatus based on the candidate observation condition does not satisfy a condition; and generate display data for presenting the candidate observation condition to output the display data.

According to the present invention, observation conditions under which a measurement apparatus observes a target sample can be set easily and rapidly. Other problems, configurations, and effects than those described above will become apparent in the descriptions of embodiments below.

BRIEF DESCRIPTION OF THE DRAWINGS

The present invention can be appreciated by the description which follows in conjunction with the following figures, wherein.

DETAILED DESCRIPTION OF THE PREFERRED EMBODIMENTS

Now, a description is given of an embodiment of this invention referring to the drawings. It should be noted that this invention is not to be construed by limiting the invention to the content described in the following embodiment. A person skilled in the art would easily recognize that a specific configuration described in the following embodiment may be changed within the scope of the concept and the gist of this invention.

In a configuration of this invention described below, the same or similar components or functions are assigned with the same reference numerals, and a redundant description thereof is omitted here.

Notations of, for example, "first", "second", and "third" herein are assigned to distinguish between components, and do not necessarily limit the number or order of those components.

The position, size, shape, range, and others of each component illustrated in, for example, the drawings may not represent the actual position, size, shape, range, and other metrics in order to facilitate understanding of this invention. Thus, this invention is not limited to the position, size, shape, range, and others described in, for example, the drawings.

Embodiment 1

Figure 1:
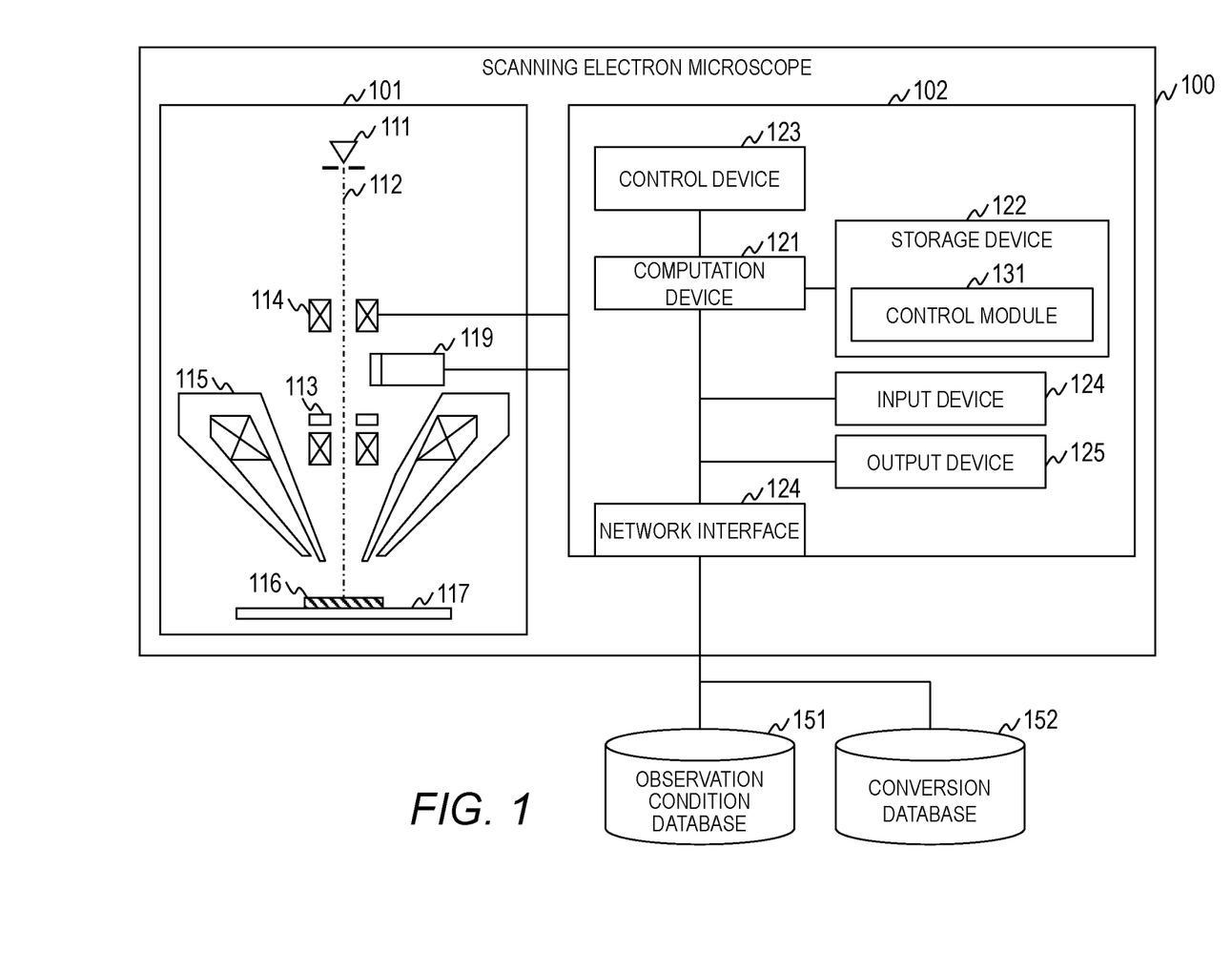
FIG. 1 is a diagram showing an example of the configuration of a measurement system in Embodiment 1.

FIG. 1 is a diagram showing an example of the configuration of a measurement system in Embodiment 1.

The measurement system includes a scanning electron microscope 100, an observation condition database 151 and a conversion database 152.

Although in Embodiment 1, as an example of a measurement apparatus (charged particle beam apparatus) used for the measurement of the shape and the like of a sample, the scanning electron microscope 100 is used, the measurement apparatus is not limited to the scanning electron microscope 100.

The scanning electron microscope 100 is formed with an electron optical system, a stage mechanism system, an SEM control system, a signal processing system and an SEM operation system. More specifically, the scanning electron microscope 100 is formed with an electron optical system tube 101 including the electron optical system and the stage mechanism system and a control unit 102 including the SEM control system, the signal processing system and the SEM operation system.

The electron optical system is formed with an electron gun 111, a deflector 113, an objective lens 115 and a detector 119.

The electron gun 111 outputs a primary electron beam 112. The focus and the like of the primary electron beam 112 are adjusted when the primary electron beam 112 passes through the deflector 113, a lens 114 and the objective lens 115. The path of the primary electron beam 112 is deflected when the primary electron beam 112 passes through the deflector 113 so as to two-dimensionally scan a sample 116. Emission electrons such as secondary electrons or reflection electrons that are emitted from the sample 116 to which the primary electron beam 112 is applied are detected with the detector 119. The signals of the emission electrons detected with the detector 119 are processed with the control unit 102. A two-dimensional image corresponding to the position of application of the primary electron beam 112 is displayed on, for example, an output device 125.

The stage mechanism system is formed with a sample holder 117 including a stage on which the sample 116 is placed. In the stage, tilt control and movement control in three-dimensional directions (XYZ axes) can be performed.

The control unit 102 includes a computation device 121, a storage device 122, a control device 123, an input device 124 and an output device 125. The control unit 102 may include storage media such as an HDD (Hard Disk Drive) and an SSD (Solid State Drive).

The computation device 121 executes predetermined computation processing according to a program stored in the storage device 122. As the computation device 121, for example, a CPU (Central Processing Unit), a GPU (Graphics Processing Unit) and the like can be considered.

The storage device 122 stores the program executed by the computation device 121 and data used in the program. The storage device 122 includes a temporary storage region such as a work area used by the program. As the storage device 122, for example, a memory and the like can be considered. The program and data stored in the storage device 122 will be described later.

The control device 123 controls, based on observation conditions, the electron optical system tube 101, that is, the output of the primary electron beam 112, the detection of the emission electrons in the detector 119 and the like. The control device 123 is connected so as to be able to communicate with the deflector 113 and the like.

The input device 124 is a device which inputs data, and includes a keyboard, a mouse, a touch panel and the like. The output device 125 is a device which outputs data, and includes a touch panel, a display and the like.

The storage device 122 stores a program which realizes a control module 131. The storage device 122 may store unillustrated programs and information. For example, the storage device 122 stores observation condition information for managing the observation conditions such as an acceleration voltage, a probe current, a scanning width (irradiation time), the number of pixel splits (irradiation cycle) and a timing delay. The storage device 122 may store image management information for managing a potential contrast image generated from the detected emission electrons.

The control module 131 executes processing for setting the observation conditions. The control module 131 controls the individual constituent parts of the electron optical system tube 101 based on the observation conditions set by the processing described above so as to generate images such as the potential contrast image from the signals of the emission electrons.

The control unit 102 may include an image generation module which generates images separately from the control module 131.

In the present Embodiment, the SEM control system is formed with the control module 131 and the control device 123, the signal processing system is formed with the control module 131 and the SEM operation system is formed with the input device 124 and the output device 125.

The observation condition database 151 is a database which stores information on the observation conditions. Information generated based on past operation logs, manuals, books, research papers and the like is stored in the observation condition database 151. The data structure of the observation condition database 151 will be described with reference to FIG. 2.

The conversion database 152 is a database that stores information on the conversion rules of observation conditions between scanning electron microscopes 100 in which apparatus configurations and the like are different. The data structure of the conversion database 152 will be described with reference to FIG. 3. The observation condition database 151 and the conversion database 152 may be realized with a general-purpose calculator or may be realized with a storage system. The scanning electron microscope 100 may include the observation condition database 151 and the conversion database 152.

The observation condition database 151 and the conversion database 152 may be provided either within the system or outside the system.

Figure 2:
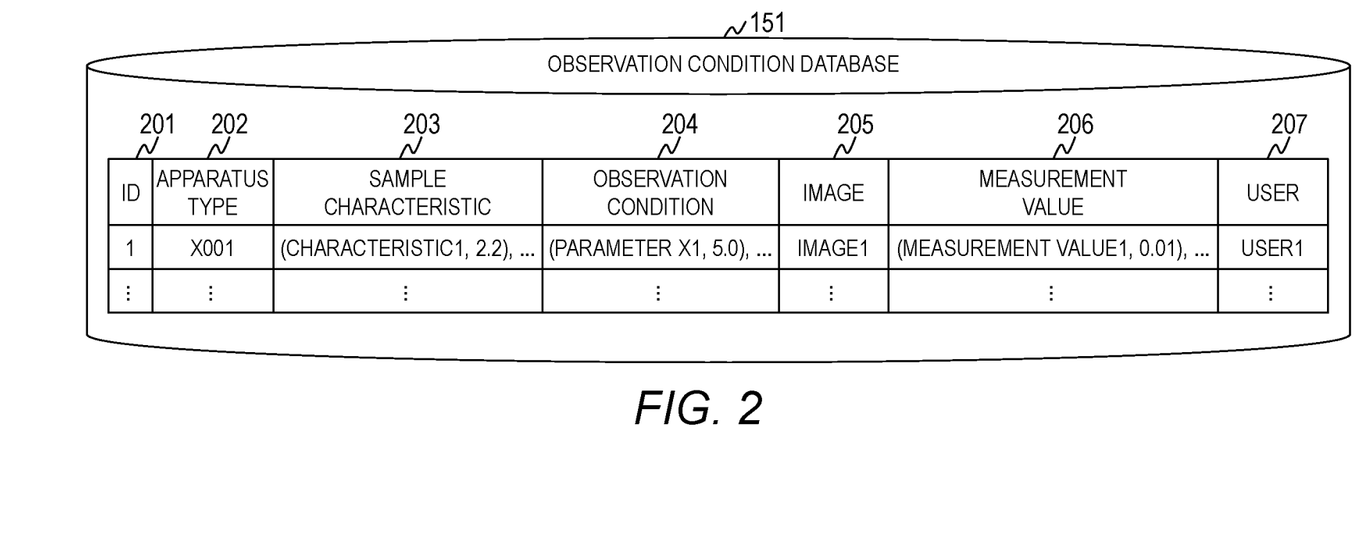
FIG. 2 is a diagram illustrating an example of the data structure of observation condition database in Embodiment 1.

FIG. 2 is a diagram illustrating an example of the data structure of the observation condition database 151 in Embodiment 1.

The observation condition database 151 stores one or more entries corresponding to the observation conditions. The entry is formed with an ID 201, an apparatus type 202, a sample characteristic 203, an observation condition 204, an image 205, a measurement value 206 and a user 207.

The ID 201 is a field in which identification information for uniquely identifying the entry included in the observation condition database 151 is stored.

The apparatus type 202 is a field in which information indicating the type of scanning electron microscope 100 is stored. In the apparatus type 202, the product name, the model number and the like of the scanning electron microscope 100 are stored.

The sample characteristic 203 is a field in which the characteristic of the sample 116 is stored. The sample characteristic 203 includes one or more combinations of the types of characteristics and values.

The observation condition 204 is a field in which observation conditions are stored. The observation condition 204 includes one or more combinations of the types of parameters and values. Examples of the parameter include an acceleration voltage, a current, a scan rate, a field-of-view size, a pixel size, the convergence conditions of a charged particle beam, electronic signal obtaining conditions in the detector 119 (such as the discrimination conditions of energy and angles and the amplification rate of electronic signals), a bias voltage to the sample and the like.

The image 205 is a field in which images generated by the scanning electron microscope 100 are stored. The measurement value 206 is a field in which values detected with the detector 119, values calculated from images or the like are stored. The measurement value 206 includes one or more combinations of the types of measurement values and values.

The user 207 is a field in which the identification information of a user who performs the observation of the sample is stored. In the user 207, the ID, the name, the official position of the user and the name of a department to which the user belongs or the like are stored.

Figure 3:
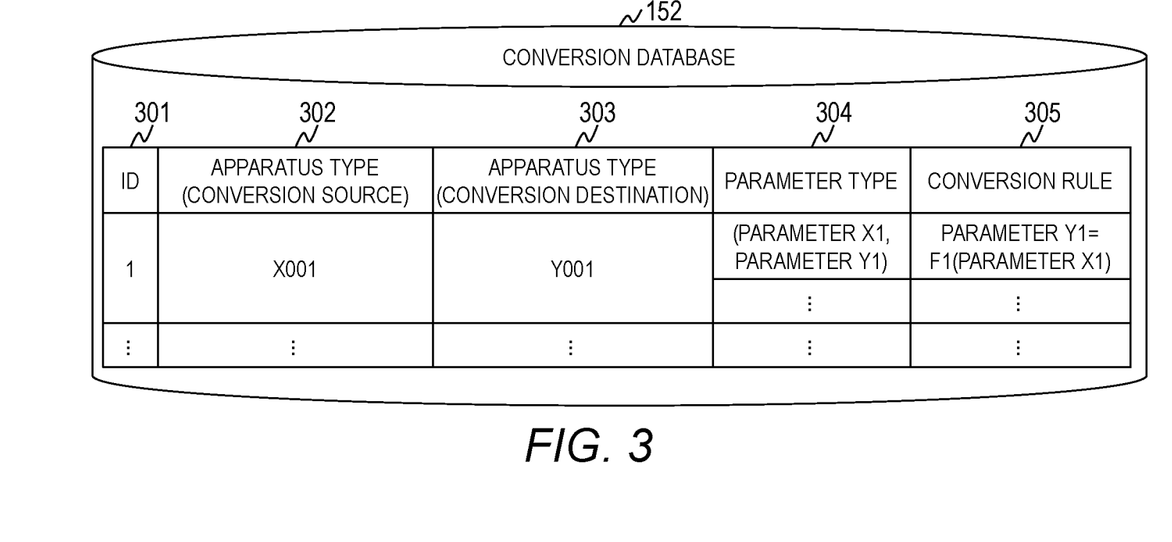
FIG. 3 is a diagram illustrating an example of the data structure of conversion database in Embodiment 1.

FIG. 3 is a diagram illustrating an example of the data structure of the conversion database 152 in Embodiment 1.

The conversion database 152 stores one or more entries corresponding to the conversion rules of observation conditions. The entry is formed with an ID 301, an apparatus type (conversion source) 302, an apparatus type (conversion destination) 303, a parameter type 304 and a conversion rule 305.

The ID 301 is a field in which identification information for uniquely identifying the entry included in the conversion database 152 is stored.

The apparatus type (conversion source) 302 is a field in which information indicating the type of scanning electron microscope 100 that is a conversion source is stored. The apparatus type (conversion destination) 303 is a field in which information indicating the type of scanning electron microscope 100 that is a conversion destination is stored.

The parameter type 304 is a field in which a combination of the identification information of the parameter of the scanning electron microscope 100 that is the conversion source and the identification information of the parameter of the scanning electron microscope 100 that is the conversion destination is stored.

The conversion rule 305 is a field in which conversion rules between the parameters are stored. For example, in the conversion rule 305, a mathematical formula, a program code and the like are stored.

Figure 4A:
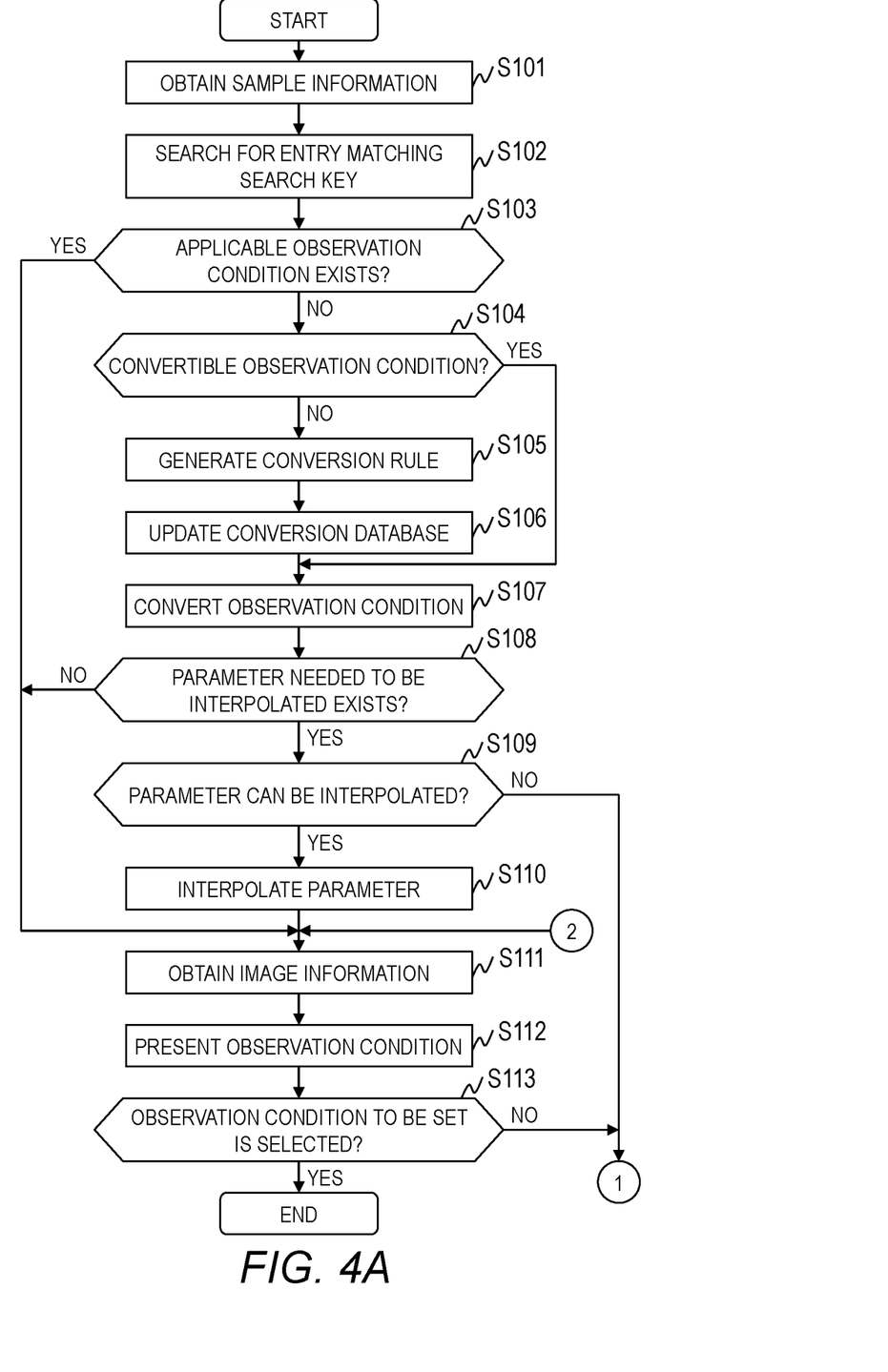
FIGS. 4A and 4B are flowcharts illustrating an example of observation condition search processing executed by a control module in Embodiment 1.
Figure 4B:
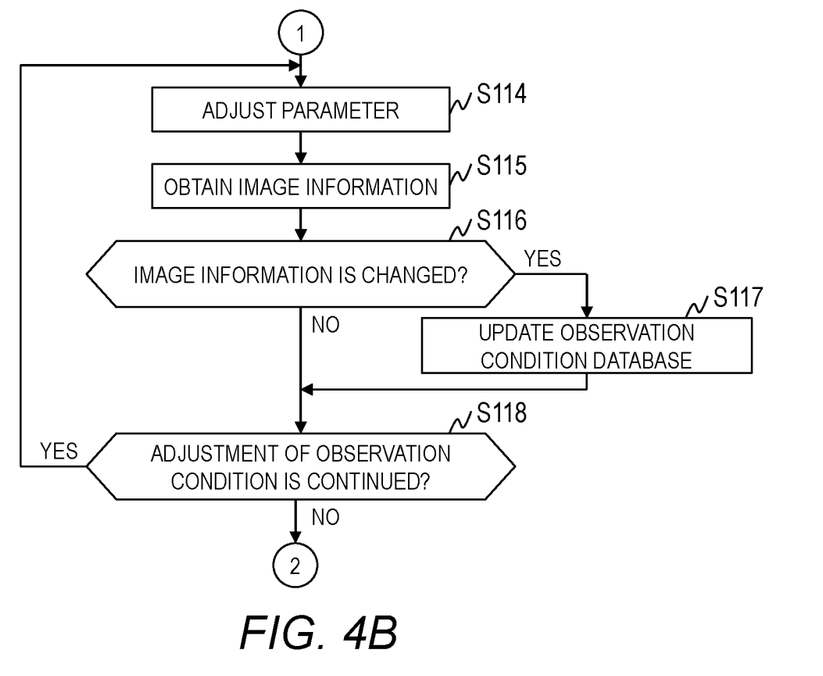
Figure 5:
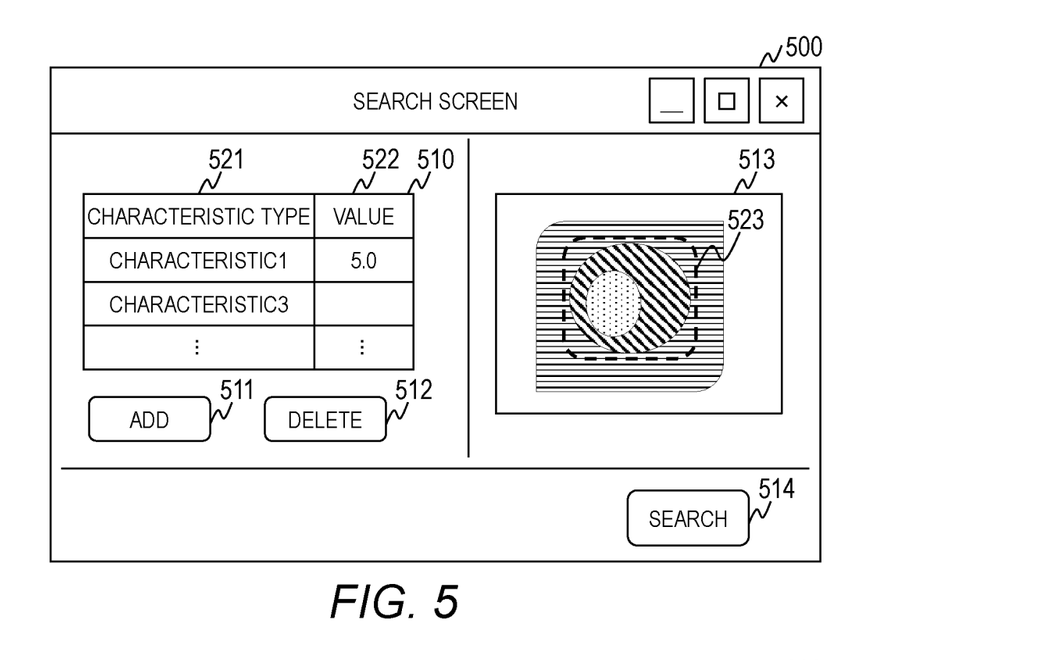
FIG. 5 is a diagram illustrating an example of a screen displayed in a case of starting the observation condition search processing in Embodiment 1.
Figure 6:
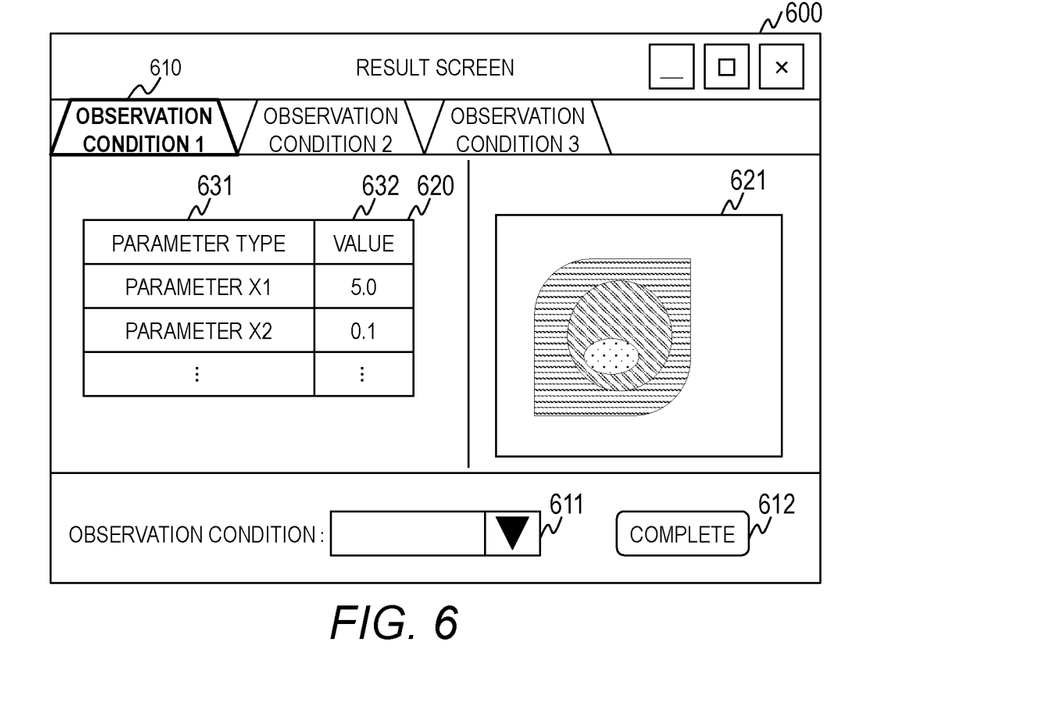
FIG. 6 is a diagram illustrating an example of a screen displaying candidate observation conditions determined by the observation condition search processing in Embodiment 1.

FIGS. 4A and 4B are flowcharts illustrating an example of observation condition search processing executed by the control module 131 in Embodiment 1. FIG. 5 is a diagram illustrating an example of a screen displayed in a case of starting the observation condition search processing in Embodiment 1. FIG. 6 is a diagram illustrating an example of a screen displaying candidate observation conditions determined by the observation condition search processing in Embodiment 1.

The control module 131 first displays, on the output device 125, a screen 500 as shown in FIG. 5. The screen 500 includes a sample condition input column 510, an addition button 511, a deletion button 512, an image input column 513 and a search button 514. As will be described later, the user uses the screen 500 to set a search key associated with the sample 116.

The sample condition input column 510 is a column for setting the characteristic of the sample 116 which is input as the search key. In the following description, the entry which is set in the sample condition input column 510 is also referred to as a character string search key.

The sample condition input column 510 includes one or more entries formed with a characteristic type 521 and a value 522. The characteristic type 521 is a field in which the type of characteristic of the sample 116 is stored. The value 522 is a field in which a specific value of the characteristic of the sample 116 is stored.

The addition button 511 is a button for adding an entry to the sample condition input column 510. The deletion button 512 is a button for deleting an entry from the sample condition input column 510.

The image input column 513 is a column for setting an image which is input as the search key and which is an observation result of the sample 116. In the image input column 513, an image (the model of an image) which is desired to be obtained as the observation result is set. In the following description, the image which is set in the image input column 513 is also referred to as an image search key.

In the image, a region 523 of interest by the user may be specified. In this case, an image in the specified region is set as the image search key.

The search button 514 is a button for providing an instruction to execute the observation condition search processing. In a case where the search button 514 is operated, an observation condition search request including the character string search key and the image search key as sample information is input to the control module 131. The sample information may include only either of the character string search key and the image search key. The sample information includes information on the type of scanning electron microscope 100 which observes the sample 116.

In a case where the control module 131 receives the observation condition search request, the control module 131 obtains the sample information from the observation condition search request (step S101).

Then, the control module 131 searches for an entry in which the sample characteristic 203 includes a combination matching the character string search key and in which the image 205 matches the image search key (step S102). As a search method, for example, processing as described below can be considered.

(Processing A1) The control module 131 converts a combination stored in the sample characteristic 203 into a vector, and also converts the character string search key into a vector. The control module 131 converts the pieces of information into the vectors such that element counts are equal to each other. For example, 0 is set to a characteristic whose value is not present. The control module 131 calculates a distance between the two vectors, and in a case where the distance of the vectors is less than a threshold value, it is determined that the sample characteristic 203 includes the combination matching the character string search key.

(Processing A2) The control module 131 converts an image in the image 205 and the image search key into vectors. In a case where the sizes of the images are different, the control module 131 rescales either of the images. The control module 131 calculates a distance between the two vectors, and in a case where the distance of the vectors is less than a threshold value, it is determined that the image 205 matches the image search key. In a case where a region is specified, the same processing is executed on the specified region.

Instead of the vector, a contrast in a specific area of an image, a frequency fluctuation, a differential value or the like may be used to perform the determination.

Then, the control module 131 determines whether or not an applicable observation condition is present in the searched observation conditions (step S103).

Specifically, the control module 131 determines whether or not the following conditions are satisfied.

(Condition 1) Observation conditions matching the search keys are present.

(Condition 2) The searched observation conditions include all the values of parameters essential for the control.

(Condition 3) The apparatus type 202 of the entry corresponding to the searched observation conditions matches the type of scanning electron microscope 100.

In a case where any one of (Condition 1), (Condition 2) and (Condition 3) is not satisfied, the control module 131 determines that an applicable observation condition is not present in the searched observation conditions. It is assumed that the parameters essential for the control are previously set.

In a case where it is determined that an applicable observation condition is present in the searched observation conditions, the control module 131 controls the electron optical system tube 101 based on the searched observation conditions so as to obtain the image of the sample 116 (step S111), and presents the searched observation conditions as the candidate observation conditions (step S112). Thereafter, the control module 131 proceeds to step S113.

In a case where it is determined that an applicable observation condition is not present in the searched observation conditions, the control module 131 determines whether or not the searched observation conditions are convertible observation conditions (step S104).

Specifically, the control module 131 references the conversion database 152 so as to search for an entry (conversion rule) in which the apparatus type 302 matches the type of scanning electron microscope 100 and in which the apparatus type 303 matches the apparatus type 202. In a case where the conversion rule satisfying the conditions described above is not present, the control module 131 determines that the searched observation conditions are not convertible observation conditions.

In a case where it is determined that the searched observation conditions are convertible observation conditions, the control module 131 converts the searched observation conditions based on the searched conversion rule in step S104 (step S107).

In a case where it is determined that the searched observation conditions are not convertible observation conditions, the control module 131 calculates a conversion rule (step S105), and updates the conversion database 152 (step S106).

Specifically, the control module 131 converts the searched observation conditions based on an arbitrary algorithm, and controls the electron optical system tube 101 based on the converted observation conditions to obtain the image of the sample 116. Random observation conditions may be set. The control module 131 calculates the conversion rule by using the image 205 of the entry corresponding to the searched observation conditions and the obtained image. Furthermore, the control module 131 registers the calculated conversion rule in the conversion database 152.

Then, the control module 131 converts the searched observation conditions based on the newly calculated conversion rule (step S107).

Then, the control module 131 determines whether or not a parameter which needs to be interpolated is present in the converted observation conditions (step S108).

In a case where it is determined that a parameter which needs to be interpolated is not present in the converted observation conditions, the control module 131 controls the electron optical system tube 101 based on the converted observation conditions so as to obtain the image of the sample 116 (step S111), and presents the converted observation conditions as the candidate observation conditions (step S112). Thereafter, the control module 131 proceeds to step S113.

In a case where it is determined that a parameter which needs to be interpolated is present in the converted observation conditions, the control module 131 determines whether or not the parameter can be interpolated (step S109).

In a case where it is determined that the parameter can be interpolated, the control module 131 interpolates the parameter (step S110). The control module 131 controls the electron optical system tube 101 based on the observation conditions including the interpolated parameter so as to obtain the image of the sample 116 (step S111), and presents the observation conditions including the interpolated parameter as the candidate observation conditions (step S112). Thereafter, the control module 131 proceeds to step S113.

In a case where it is determined that the parameter cannot be interpolated, the control module 131 adjusts the parameter which needs to be interpolated (step S114), and controls the electron optical system tube 101 based on the observation conditions including the adjusted parameter to obtain the image of the sample 116 (step S115).

Then, the control module 131 compares the image obtained this time and the image obtained previously so as to determine whether or not the image is changed (step S116). For example, when the rate of change of a contrast in the entire image is greater than a threshold value, the control module 131 determines that the image is changed. In a case where the image obtained previously is not present, the control module 131 determines that the image is not changed.

In a case where it is determined that the image is changed, the control module 131 registers, in the observation condition database 151, the entry of the observation conditions including the adjusted parameter (step S117). Thereafter, the control module 131 proceeds to step S118.

In a case where it is determined that the image is not changed, the control module 131 proceeds to step S118.

In step S118, the control module 131 determines whether or not the adjustment of the observation conditions is continued (step S118). For example, in a case where the rate of change from the image obtained previously to the image obtained this time is less than a threshold value, the control module 131 determines that the adjustment of the observation conditions is not continued. This is because in a case where the image is not changed, it is highly likely that only observation conditions equivalent to the existing observation conditions are found.

In a case where it is determined that the adjustment of the observation conditions is continued, the control module 131 returns to step S114 so as to execute the same processing.

In a case where it is determined that the adjustment of the observation conditions is not continued, the control module 131 controls the electron optical system tube 101 based on the observation conditions registered in step S117 so as to obtain the image of the sample 116 (step S111), and presents the observation conditions registered in step S117 as the candidate observation conditions (step S112). Thereafter, the control module 131 proceeds to step S113.

In a case where a plurality of observation conditions are searched for in step S102, the processing from step S103 to step S118 is executed on each of the observation conditions.

Here, a method for presenting the observation conditions will be described with reference to FIG. 6. The control module 131 displays, on the output device 125, a screen 600 as shown in FIG. 6. The screen 600 includes an observation condition tab 610, a selection column 611 and a completion button 612.

The observation condition tab 610 is a tab for specifying the candidate observation conditions which are displayed. When the observation condition tab 610 is selected, a screen which includes an observation condition display column 620 and an image display column 621 is displayed.

The observation condition display column 620 includes a plurality of entries formed with a parameter type 631 and a value 632. One entry corresponds to the setting value of one parameter. The parameter type 631 is a field in which the types of parameters are stored. The value 632 is a field in which the values of parameters are stored.

The image display column 621 is a column in which the image of the sample 116 obtained by controlling the electron optical system tube 101 based on the observation conditions corresponding to the observation condition display column 620 is displayed.

The selection column 611 is a column for selecting the observation conditions which are set for the electron optical system tube 101. In the selection column 611, the identification information of the observation conditions corresponding to the observation condition tab 610 is displayed in a pull-down menu. The completion button 612 is a button for completing the browsing of the screen 600. In a case where the completion button 612 is operated, the control module 131 obtains the identification information of the observation conditions set in the selection column 611.

A description will be given with reference back to FIGS. 4A and 4B.

After step S112, the control module 131 determines whether or not the observation conditions which are set for the electron optical system tube 101 are selected (step S113). In other words, whether or not the observation conditions under which an image required by the user can be acquired are present is determined.

Specifically, the control module 131 determines whether or not the identification information of the observation conditions is set in the selection column 611. In a case where the identification information of the observation conditions is set in the selection column 611, the control module 131 determines that the observation conditions set for the electron optical system tube 101 are selected.

In a case where it is determined that the observation conditions set for the electron optical system tube 101 are not selected, the control module 131 proceeds to step S114.

In a case where it is determined that the observation conditions set for the electron optical system tube 101 are selected, the control module 131 completes the observation condition search processing.

Even when as described above, the number of combinations of the values of a plurality of parameters is enormous, that is, even when the parameter space of search conditions is huge, the measurement system can search for observation conditions serving as candidates based on a search key. Even when the searched observation conditions cannot be applied without being processed, the measurement system can calculate observation conditions serving as candidates with reference to the searched observation conditions. In other words, the search range of the parameter space is narrowed, and thus observation conditions serving as candidates can be calculated.

Although the observation condition database 151 of Embodiment 1 is described as the data in a table form as shown in FIG. 2, the observation condition database 151 is not limited to this configuration. For example, the observation condition database 151 may be a database in which research papers, books, manuals and the like are stored. In this case, the control module 131 searches for research papers and the like including information matching sample information based on known text mining or image mining, and extracts observation conditions described in the search papers and the like.

The measurement system may include a terminal which is connected to the scanning electron microscope 100. In this case, the terminal may have the function of the control module 131.

The measurement system described in Embodiment 1 searches for observation conditions serving as candidates based on the search key so as to be able to present them. The user only inputs at least either of the character string search key and the image search key without need to perform a conventional trial-and-error method. Hence, the observation conditions can be set easily and rapidly. Even a user who does not have expertise and know-how on the apparatus can easily set the observation conditions. An image is presented together with the observation conditions serving as candidates, and thus it is possible to support the selection of the observation conditions by the user.

Embodiment 2

In Embodiment 2, a search key which is input in a case where observation condition search processing is started is different. Embodiment 2 will be described below mainly on differences from Embodiment 1.

The configuration of a measurement system in Embodiment 2 is the same as in Embodiment 1. The configuration of a scanning electron microscope 100 is the same as in Embodiment 1. The data structures of an observation condition database 151 and a conversion database 152 in Embodiment 2 are the same as in Embodiment 1.

Figure 7:
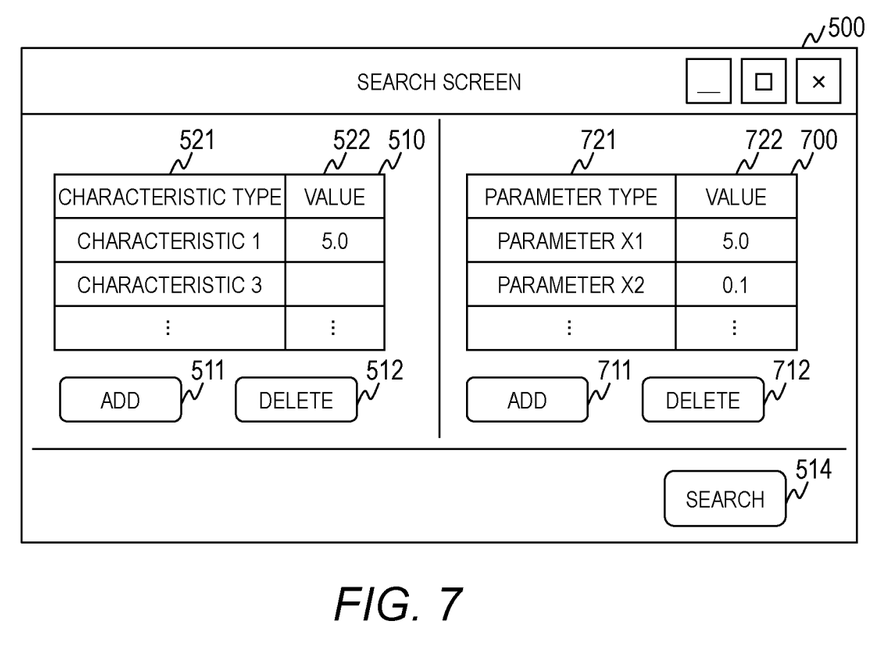
FIG. 7 is a diagram illustrating an example of a screen displayed in a case of staring the observation condition search processing of Embodiment 2.

In Embodiment 2, the observation condition search processing is partially different. A description will first be given of a screen 500 which is displayed on an output device 125 by a control module 131 in Embodiment 2. FIG. 7 is a diagram illustrating an example of a screen displayed in a case of staring the observation condition search processing of Embodiment 2.

The screen 500 includes a sample condition input column 510, an addition button 511, a deletion button 512, a temporary observation condition input column 700, an addition button 711, a deletion button 712 and a search button 514. The sample condition input column 510, the addition button 511, the deletion button 512, and the search button 514 are the same as in Embodiment 1.

The temporary observation condition input column 700 is a column for setting observation conditions which are set as initial values. An entry set in the temporary observation condition input column 700 is input as an image search key. The temporary observation condition input column 700 includes at least one or more entries formed with a parameter type 721 and a value 722. The parameter type 721 is a field in which the types of parameters are stored. The value 722 is a field in which the specific values of parameters are stored.

The addition button 711 is a button for adding an entry to the temporary observation condition input field 700. The deletion button 712 is a button for deleting an entry from the temporary observation condition input field 700.

The observation condition search processing of Embodiment 2 will then be described. In Embodiment 2, after processing in step 101, the control module 131 outputs, to the control device 123, temporary observation conditions input as the image search key so as to obtain an image. The control module 131 sets the obtained image as the image search key which is used in actual processing. Processing subsequent to step S102 is the same as in Embodiment 1.

The measurement system described in Embodiment 2 utilizes the know-how of the user so as to be able to search for and present observation conditions serving as candidates more rapidly.

The present invention is not limited to the above embodiment and includes various modification examples. In addition, for example, the configurations of the above embodiment are described in detail so as to describe the present invention comprehensibly. The present invention is not necessarily limited to the embodiment that is provided with all of the configurations described. In addition, a part of each configuration of the embodiment may be removed, substituted, or added to other configurations.

A part or the entirety of each of the above configurations, functions, processing units, processing means, and the like may be realized by hardware, such as by designing integrated circuits therefor. In addition, the present invention can be realized by program codes of software that realizes the functions of the embodiment. In this case, a storage medium on which the program codes are recorded is provided to a computer, and a CPU that the computer is provided with reads the program codes stored on the storage medium. In this case, the program codes read from the storage medium realize the functions of the above embodiment, and the program codes and the storage medium storing the program codes constitute the present invention. Examples of such a storage medium used for supplying program codes include a flexible disk, a CD-ROM, a DVD-ROM, a hard disk, a solid state drive (SSD), an optical disc, a magneto-optical disc, a CD-R, a magnetic tape, a non-volatile memory card, and a ROM.

The program codes that realize the functions written in the present embodiment can be implemented by a wide range of programming and scripting languages such as assembler, C/C++, Perl, shell scripts, PHP, and Java.

It may also be possible that the program codes of the software that realizes the functions of the embodiment are stored on storing means such as a hard disk or a memory of the computer or on a storage medium such as a CD-RW or a CD-R by distributing the program codes through a network and that the CPU that the computer is provided with reads and executes the program codes stored on the storing means or on the storage medium.

In the above embodiment, only control lines and information lines that are considered as necessary for description are illustrated, and all the control lines and information lines of a product are not necessarily illustrated. All of the configurations of the embodiment may be connected to each other.

What is claimed is:

1. A measurement system comprising: a measurement apparatus observing a sample based on an observation condition including a plurality of parameters; and an observation condition database storing first data in which a search key related to the sample and the observation condition set in a case of observing the sample are associated with each other, the measurement system further comprising: a control unit being configured to calculate information on an observation condition of a sample, the control unit being configured to:
receive an observation condition search request including a search key related to a target sample;
refer the observation condition database to search for the first data matching or similar to the search key related to the target sample included in the observation condition search request,
calculate, based on the searched first data, a candidate observation condition of the measurement apparatus for observing the target sample,
adjust at least one parameter included in the candidate observation condition to calculate new candidate observation condition in a case where a result of a measurement performed by the measurement apparatus based on the candidate observation condition does not satisfy a condition; and
generate display data for presenting the candidate observation condition to output the display data.

2. The measurement system according to claim 1, further comprising:
a conversion database managing second data in which a combination of types of measurement apparatuses and a conversion rule of the observation condition are associated with each other,
wherein the first data includes first type data for identifying a type of a measurement apparatus,
wherein the observation condition search request includes second type data for identifying a type of the measurement apparatus included in the measurement system and
wherein the control unit is configured to:
refer the conversion database to search for the second data corresponding to a combination of the first type data included in the searched first data and the second type data included in the observation condition search request and
convert the observation condition included in the searched first data based on the searched second data to calculate the candidate observation conditions.

3. The measurement system according to claim 2,
wherein the first data includes observation result of the sample, and
wherein the control unit is configured to:
generate the second data by using the candidate observation condition and observation result of an observation based on the candidate observation condition, and the observation condition and the observation result which are included in each of a plurality of pieces of the first data stored in the observation condition database, and
stores the generated second data in the conversion database.

4. The measurement system according to claim 1,
wherein the observation condition search request includes, as the search key related to the target sample, information on a characteristic of the target sample,
wherein the first data includes information on a characteristic of the sample, and
wherein the control unit is configured to refer the observation condition database to search for the first data including information on a characteristic of the sample matching or similar to the characteristic of the target sample included in the observation condition search request.

5. The measurement system according to claim 1,
wherein the observation condition search request includes, as the search key related to the target sample, a desired image serving as an observation result of the target sample,
wherein the first data includes an image as the observation result of the sample and
wherein the control unit is configured to refer the observation condition database to search for the first data including an image matching or similar to the image included in the observation condition search request.

6. The measurement system according to claim 5,
wherein the observation condition search request includes information specifying a region of the image, and
wherein the control unit is configured to refer the observation condition database to search for the first data including an image including a region matching or similar to the region of the image included in the observation condition search request.

7. The measurement system according to claim 1,
wherein the control unit is configured to:
calculate a value of at least one parameter set for the measurement apparatus included in the measurement system in a case where the value is not included in the observation condition included in the searched first data; and
include the calculated value of the at least one parameter in the observation condition included in the searched first data to calculate the observation condition of the measurement apparatus for observing the target sample.

8. A method for setting observation conditions set for a measurement apparatus in a measurement system including the measurement apparatus observing a sample based on an observation condition including a plurality of parameters,
the measurement system including a control unit calculating information on an observation condition of a sample; and an observation condition database storing first data in which a search key related to the sample and the observation condition set in a case where the sample is observed are associated with each other, and
the method for setting observation conditions includes:
a first step of receiving, by the control unit, an observation condition search request including a search key related to a target sample;
a second step of referring, by the control unit, the observation condition database to search for the first data matching or similar to the search key related to the target sample included in the observation condition search request;
a third step of calculating, by the control unit, a candidate observation condition of the measurement apparatus for observing the target sample based on the searched first data;
a fourth step of adjusting, by the control unit, at least one parameter included in the candidate observation condition to calculate new candidate observation condition in a case where a result of a measurement performed by the measurement apparatus based on the candidate observation condition does not satisfy a condition; and
a fifth step of generating, by the control unit, display data for presenting the candidate observation condition to output the display data.

9. The method for setting observation conditions according to claim 8,
wherein the measurement system includes a conversion database managing second data in which a combination of types of measurement apparatuses and a conversion rule of the observation condition are associated with each other,
wherein the first data includes first type data for identifying a type of a measurement apparatus,
wherein the observation condition search request includes second type data for identifying a type of the measurement apparatus included in the measurement system, and
wherein the third step includes:
a step of referencing, by the control unit, the conversion database to search for the second data corresponding to a combination of the first type data included in the searched first data and the second type data included in the observation condition search request; and
a step of converting, by the control unit, the observation conditions included in the searched first data based on the searched second data to calculate the candidate observation condition.

10. The method for setting observation conditions according to claim 9,
wherein the first data includes an observation result of the sample, and
wherein the method for setting observation conditions further includes:
a step of generating, by the control unit, the second data by using the candidate observation condition and an observation result of an observation based on the candidate observation condition, and the observation condition and the observation result which are included in each of a plurality of pieces of the first data stored in the observation condition database, and
a step of storing, by the control unit, the generated second data in the conversion database.

11. The method for setting observation conditions according to claim 8,
wherein the observation condition search request includes, as the search key related to the target sample, information on a characteristic of the target sample,
wherein the first data includes information on a characteristic of the sample and
wherein the second step includes a step of referring, by the control unit, the observation condition database to search for the first data including information of a characteristic of the sample matching or similar to the characteristic of the target sample included in the observation condition search request.

12. The method for setting observation conditions according to claim 8,
wherein the observation condition search request includes, as the search key related to the target sample, a desired image serving as an observation result of the target sample,
wherein the first data includes an image as an observation result of the sample, and
wherein the second step includes a step of referring, by the control unit, the observation condition database to search for the first data including an image matching or similar to the image included in the observation condition search request.

13. The method for setting observation conditions according to claim 12,
wherein the observation condition search request includes information specifying a region of the image, and
wherein the second step includes a step of referring, by the control unit, the observation condition database to search for the first data including an image including a region matching or similar to the region of the image included in the observation condition search request.

14. The method for setting observation conditions according to claim 8,
wherein the third step includes:
a step of calculating, by the control unit, a value of at least one parameter set for the measurement apparatus included in the measurement system in a case where the value is not included in the observation condition included in the searched first data; and
a step of including, by the control unit, the calculated value of the at least one parameter in the observation condition included in the searched first data to calculate the observation condition of the measurement apparatus for observing the target sample.

* * * * *